United States Patent
Morgan et al.

(10) Patent No.: US 12,230,677 B2
(45) Date of Patent: Feb. 18, 2025

(54) QUANTUM STRUCTURE GETTER FOR RADIATION HARDENED TRANSISTORS

(71) Applicant: The United States of America, as represented by the Secretary of the Navy, Crane, IN (US)

(72) Inventors: Timothy Allen Morgan, Ellettsville, IN (US); Matthew J Gadlage, Bloomington, IN (US); Kevin Goodman, Ellettsville, IN (US); Morgan E Ware, Fayetteville, AR (US); Pijush Kanti Ghosh, Dallas, TX (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 517 days.

(21) Appl. No.: 17/553,038

(22) Filed: Dec. 16, 2021

(65) Prior Publication Data

US 2022/0285499 A1 Sep. 8, 2022

Related U.S. Application Data

(60) Provisional application No. 63/126,960, filed on Dec. 17, 2020.

(51) Int. Cl.
*H01L 29/15* (2006.01)
*H01L 27/085* (2006.01)
(Continued)

(52) U.S. Cl.
CPC .......... *H01L 29/155* (2013.01); *H01L 29/205* (2013.01); *H01L 29/66462* (2013.01);
(Continued)

(58) Field of Classification Search
CPC ................. H01L 29/155; H01L 29/205; H01L 29/66462; H01L 27/085; H01L 29/7786
See application file for complete search history.

(56) References Cited

U.S. PATENT DOCUMENTS 10,991,835 B2 * 4/2021 Maros ..................... H01L 33/06
2010/0019334 A1 * 1/2010 Ivanov .................. H01L 31/101
257/E31.093

(Continued)

*Primary Examiner* — Mamadou L Diallo
(74) *Attorney, Agent, or Firm* — Naval Surface Warfare Center, Crane Division; Christopher Feigenbutz

(57) ABSTRACT

A microelectronic device that is radiation hardened through the incorporation of a quantum structure getter (QSG) is provided. The device, such as a field effect transistor (FET) includes a conductive channel and a material stack comprising: a capping layer, one or more barrier layers comprising a high band gap, one or more quantum structures comprising a small band gap, and a substrate. The quantum structures are positioned in close proximity to the conductive channel to form a quantum well charge getter. The getter forms a low energy area beneath the FET, which traps and confines electron-hole pair wave functions produced from ionizing radiation, causing the wave functions overlap, recombine, and produce light emission. The quantum structures getter the wave functions, which reduces the ionized photocurrent that reaches the conducting channel, thereby hardening the microelectronic device against ionizing radiation.

18 Claims, 10 Drawing Sheets

(51) Int. Cl.
  *H01L 29/20* (2006.01)
  *H01L 29/205* (2006.01)
  *H01L 29/66* (2006.01)
  *H01L 29/778* (2006.01)

(52) U.S. Cl.
  CPC ........ *H01L 29/7786* (2013.01); *H01L 27/085* (2013.01); *H01L 29/2003* (2013.01)

(56) References Cited

U.S. PATENT DOCUMENTS

| | | | |
|---|---|---|---|
| 2012/0025087 A1* | 2/2012 | Daghighian | H01L 29/66462 257/E31.091 |
| 2020/0300805 A1* | 9/2020 | Ram | G01N 27/4145 |
| 2020/0350428 A1* | 11/2020 | Tanaka | H01L 29/2003 |
| 2022/0107223 A1* | 4/2022 | Ram | G01J 5/34 |

* cited by examiner

| | |
|---|---|
| Capping Layer | 102 |
| First Barrier Layer | 103 |
| Active Quantum Well | 104 |
| Second Barrier Layer | 105 |
| Quantum Structure Getter | 106 |
| Third Barrier Layer | 107 |
| Substrate | 108 |

} 101

QUANTUM STRUCTURE GETTER FOR RADIATION HARDENED TRANSISTORS

CROSS-REFERENCE TO RELATED APPLICATIONS

The present application claims priority to U.S. Provisional Patent Application Ser. No. 63/126,960, filed Dec. 17, 2020, entitled "Quantum Structure Getter for Radiation Hardened Transistors," the disclosure of which is expressly incorporated by reference herein.

STATEMENT REGARDING FEDERALLY SPONSORED RESEARCH OR DEVELOPMENT

The invention described herein includes contributions by one or more employees of the Department of the Navy made in performance of official duties and may be manufactured, used and licensed by or for the United States Government for any governmental purpose without payment of any royalties thereon. This invention (Navy Case 210092US01) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE INVENTION

The field of invention relates generally to microelectronic devices. More particularly, it pertains to a radiation hardened microelectronic device that incorporates quantum structures below active regions of the microelectronic device that getter charges created by ionizing radiation.

BACKGROUND

Ionizing radiation can wreak havoc on microelectronic devices. The creation of electron-hole pairs from an ionizing radiation event leads to charges permeating a device with the potential to destroy the device when an applied bias accelerates the charges, leading to burnout. Additional undesirable effects occur when the ionization of traps leads to altered threshold voltages and uncontrollability of the on/off state. As is known, ionizing radiation has the ability to cause bit-flip errors in solid state memories, potentially rendering a microelectronic system unstable.

One type of microelectronic device that is particularly susceptible to ionizing radiation is a field-effect transistor (FET), which is a type of transistor that uses an electric field to control the flow of current in a semiconductor. FETs are often used for amplifying or switching electronic signals, and generally include three terminals: a source, a gate, and a drain. FETs control the flow of current by the application of voltage to the gate, which then alters the conductivity between the drain and the source. The voltage of the covered gate determines the electrical conductivity of the device, which provides a FET with the ability to change conductivity with the amount of applied voltage. FETs generally display very high input impedance at low frequencies. Exposing a FET to radiation, however, can cause a variety of malfunctions. Examples include single event interrupts and dose rate burnouts, which possess the potential to cause disruptions and failures in the operation of microelectronic devices in space and other strategic environments.

Most modern power control systems are migrating towards gallium nitride (GaN) based power transistors due to the material's capability to handle high voltage, current, frequency, and temperature. GaN based power transistors, however, are especially vulnerable to exposure to high energy radiation, where failure can result in catastrophic loss of the system. To prevent such failures, heavy shielding is required. As can be appreciated, shielding comes at a great cost for any space-limited applications, and particularly for applications where reduced size is a benefit. As these examples demonstrate, a mechanism to reduce or eliminate excess charges formed in devices due to ionizing radiation exposure is crucial to their controlled use in such an environment.

SUMMARY OF THE INVENTION

Disclosed is a microelectronic device that is radiation hardened through the incorporation of a quantum structure getter (QSG). The device, such as a field effect transistor (FET), includes a conductive channel and a material stack comprising: a capping layer, one or more barrier layers comprising a high band gap, one or more quantum structures comprising a small band gap, and a substrate. The quantum structures are positioned in close proximity to the conductive channel to form a quantum well charge getter. The getter forms a low energy area beneath the FET, which traps and confines electron-hole pair wave functions produced from ionizing radiation, causing the wave functions overlap, recombine, and produce light emission. The quantum structures getter the wave functions, which reduces the ionized photocurrent that reaches the conducting channel, thereby hardening the microelectronic device against ionizing radiation. With the excess charge actively removed from the device, performance is enhanced, thereby allowing for sustained use in single event and high dose rate environments.

According to an illustrative embodiment of the present disclosure, it is an object of the invention to provide a radiation hardened microelectronic device that has all of the advantages of the prior art and none of the disadvantages.

According to a further illustrative embodiment of the present disclosure, it is an aspect of the invention to provide a radiation hardened microelectronic device that is hardened against ionizing radiation through the incorporation of a quantum structure getter.

According to yet another illustrative embodiment of the present disclosure, it is an aspect of the invention to provide a radiation hardened microelectronic device that significantly reduces the amount of ionized charge reaching the active region of the microelectronic device, which minimizes effects such as gate voltage shifting.

According to still another illustrative embodiment of the present disclosure, it is an aspect of the invention to provide a radiation hardened microelectronic device that can significantly reduce excess charges caused by ionizing radiation, which ensures continual operation in harsh environments.

According to a further illustrative embodiment of the present disclosure, it is an aspect of the invention to provide a radiation hardened microelectronic device that is compatible with many different material systems.

According to yet another illustrative embodiment of the present disclosure, it is an aspect of the invention to provide a radiation hardened microelectronic device that provides a reduction in weight and volume in comparison with heavy metal shielding of contemporary electronics.

According to still another illustrative embodiment of the present disclosure, it is an aspect of the invention to provide a radiation hardened microelectronic device that provides a greater than 99% reduction in excess charge.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

In one illustrative embodiment, provided is a radiation hardened microelectronic device comprising: a transistor comprising a conductive channel; a material stack comprising: a capping layer comprising a highly doped region in contact with the transistor; one or more barrier layers comprising a high band gap; one or more quantum structures comprising a small band gap; and a substrate. The one or more quantum structures are positioned in close proximity to the transistor conductive channel to form a quantum well charge getter structure with a low energy area beneath the transistor. The quantum well charge getter structure traps and confines electron-hole pair wave functions produced from ionizing radiation within the low energy areas, causing the wave functions overlap, recombine, and produce light emission, thereby gettering the wave functions, reducing ionized photocurrent from reaching the conducting channel of the transistor, and hardening the microelectronic device against ionizing radiation.

Figures 1, 2:
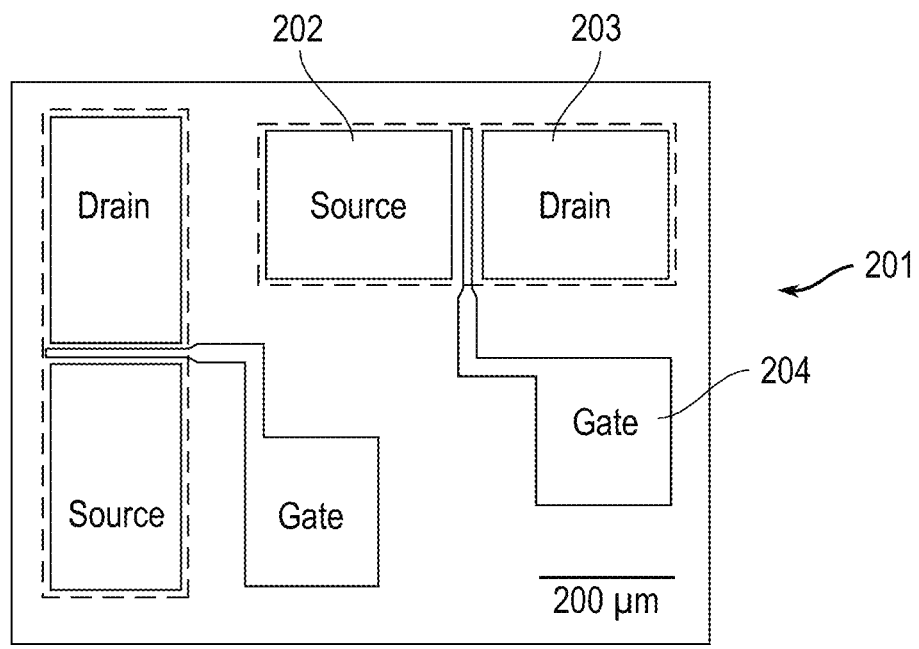
FIG. 1 shows an embodiment of the material stack for the quantum structure getter in a radiation hardened microelectronic device.
FIG. 2 shows an overhead view of a radiation hardened microelectronic device.

In a non-limiting example, the material stack comprises a capping layer comprising a highly doped region in contact with said transistor; one or more barrier or buffer layers comprising a high band gap; one or more quantum structures comprising a small band gap; and a substrate. FIG. 1 shows an illustrative embodiment of the material stack 101 for the quantum structure getter in a radiation hardened microelectronic device. In one embodiment, the material stack 101 comprises a capping layer 102, a first barrier layer 103, an active quantum well 104, a second barrier 105, a quantum structure getter 106, a third barrier 107, and a substrate 108. The capping layer 102 makes contact with the microelectronic device and preferably includes a highly doped semiconductor region. The first barrier layer 103 includes a semiconductor with a high band gap. The active quantum well 104 provides a channel for the microelectronic device that allows electrons to flow therethrough. The second barrier 105 can be the same or different than the first barrier layer 103. The quantum structure getter 106 includes a smaller band gap as compared to the barriers (103, 105, 107), which provides a low energy area beneath the microelectronic device for trapping electrons, which will be discussed in greater detail below. The quantum structure getter 106 can be constructed from a wide variety of materials and structures, but should be compatible with the FET to minimize defects added to the overall structure. Non-limiting examples of materials used in the construction of the quantum structure getter 106 can include semiconductors such as Si, Ge, Nitrides, Arsenides, inorganic compounds, oxides, 2D materials, etc.

The third barrier 107 can be the same or different than the first and second barrier layers 103, 105. The substrate 108 provides a material for supporting the microelectronic device and material stack 101. While the material stack 101 is described with multiple barrier layers, an active quantum well, and a quantum structure getter, it is contemplated that the device can be constructed with more or less barrier layers and/or active quantum wells and quantum structure getters of similar or different design.

The active FET can be made from many different materials. Non-limiting examples include semiconductors such as Si, Ge, Nitrides, Arsenides, and the like, inorganic compounds, oxides, 2D materials and the like. Quantum wells have larger density of states, but may have a restrictive alloy composition, thus limiting the energy range of the well and how well the charges can be trapped by the well. Graded structures can induce polarization that can pull additional charges into the getter layer. Repeated units of quantum wells or dots can be employed to create a more effective barrier as well. Combinations of structures (wells, wires, dots, super lattices, etc.) could also be used to make a more effective barrier depending upon the material choice for the active FET. Structures such as quantum dots can be tailored to have lower energies based on height but have lower density of states.

FIG. 2 shows an overhead view of a radiation hardened microelectronic device 201. In one embodiment, the microelectronic device is a field effect transistor (FET). In another embodiment, the microelectronic device is a high electron mobility transistor (HEMT). The HEMT is well understood in the art and comprises a source 202, a drain 203, and a gate 204. HEMTs incorporates a heterojunction between two materials with differing band gaps. The device includes an active channel through which charge carriers, electrons or holes flow from the source 202 to the drain 203. The gate 204 either permits electrons to flow or blocks their passage by creating or eliminating a channel between the source 202 and drain 203. Electron-flow from the source 202 towards the drain 203 is influenced by an applied voltage. Source 202 and drain 203 terminal conductors are connected to a semiconductor through ohmic contacts. The conductivity of the channel is a function of the potential applied across the gate 204 and source 202 terminals. Generally, the carriers enter the channel through the source 202 and leave the channel through the drain 204, while the gate 203 modulates the channel conductivity. The source 202, through which the carriers enter the channel.

Figure 3:
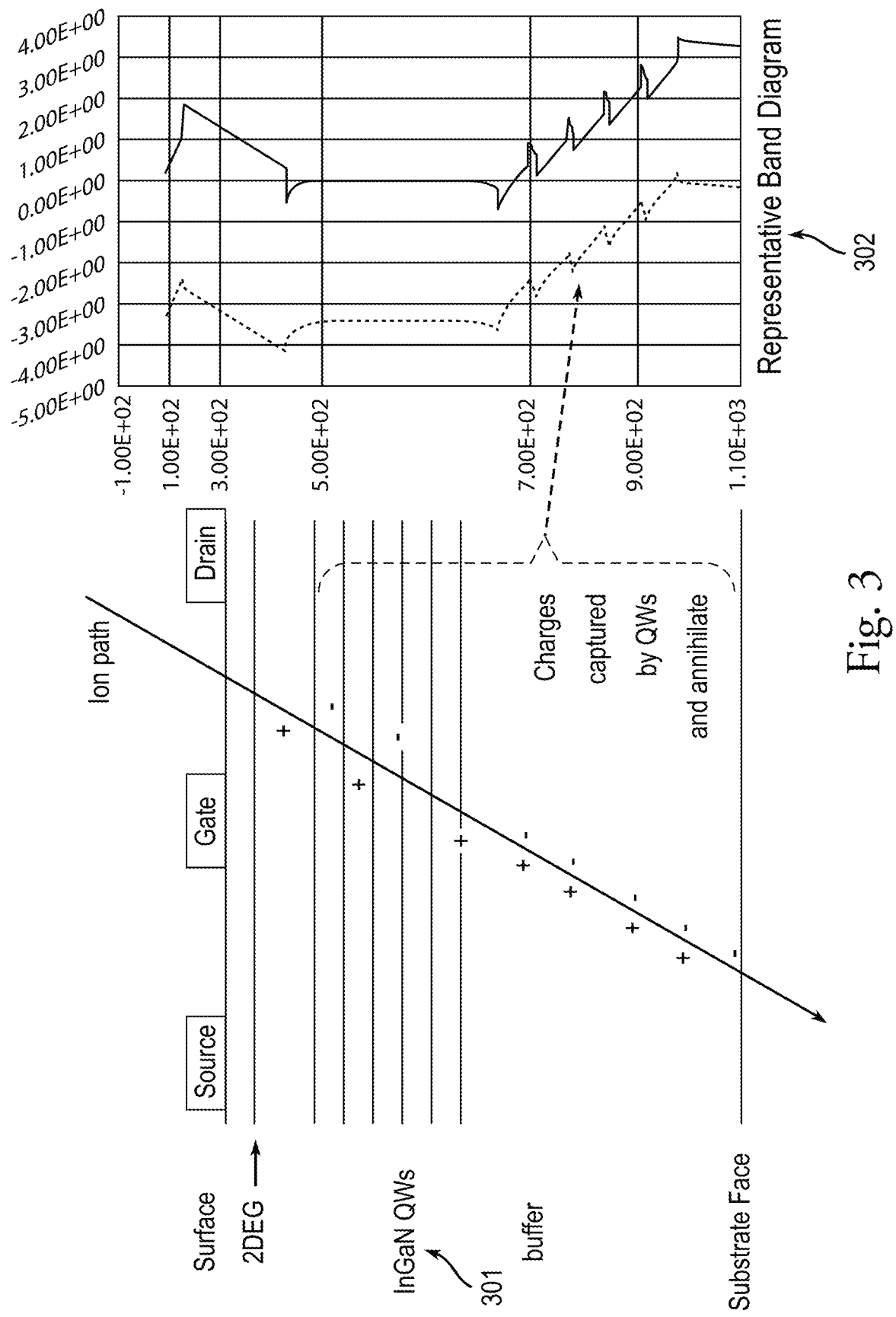
FIG. 3 shows a repeated sequence of InGaN quantum wells inserted below an AlGaN high mobility electron transistor trap.

An embodiment is illustrated in FIG. 3, which shows a repeated sequence of InGaN quantum wells 301 inserted below an AlGaN High mobility electron transistor trap. The band diagram 302, demonstrating the band structure, is shown, illustrating both the conduction band to trap electrons and valence band to trap holes, both of which are generated during radiation events. The band structure must have these levels lower in the conduction band relative to the barrier in order to trap electrons; similarly, the valence band must have higher energy levels relative to the barrier in order to trap holes.

EXAMPLE

Figure 4:
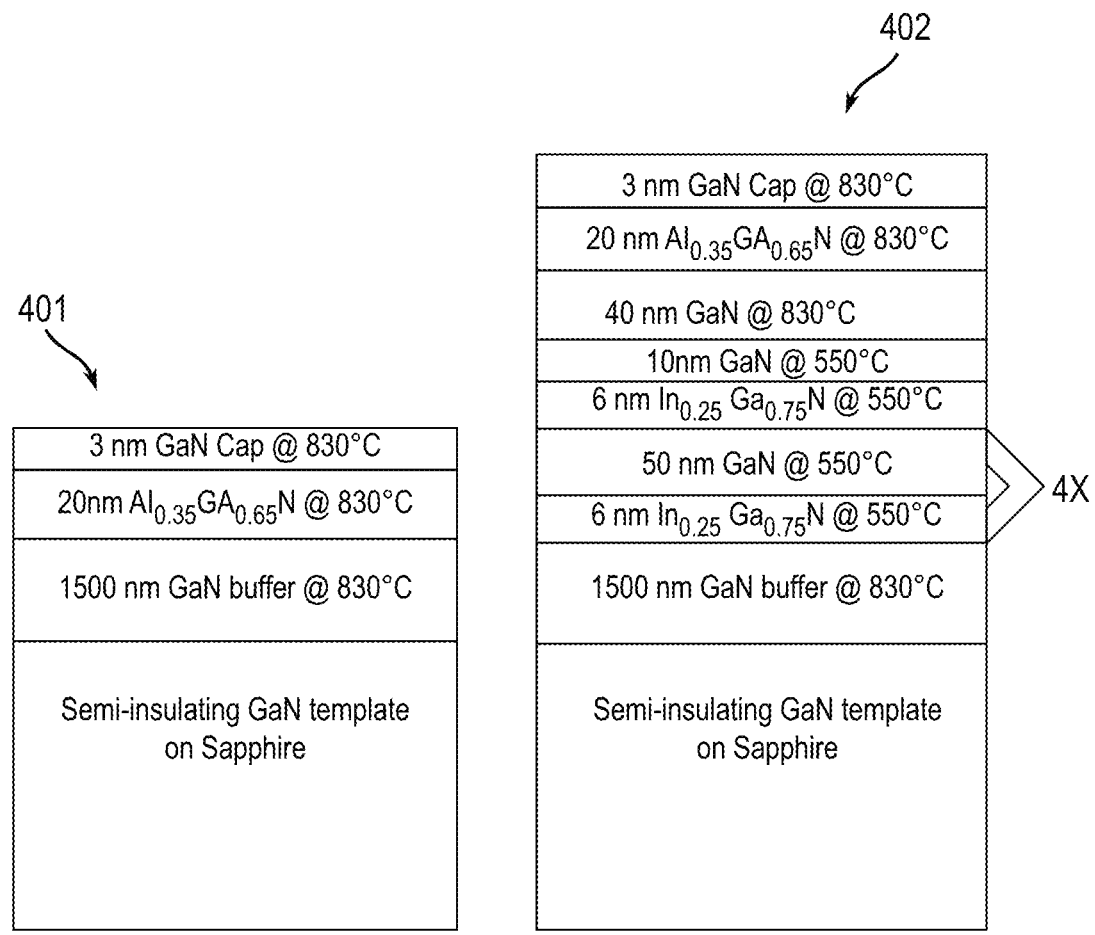
FIG. 4 shows schematics of the growth layers, the reference sample, and the sample comprising quantum wells.

The inventive radiation hardened microelectronic device and its ability to trap, confine, and getter ionizing wave functions is best understood through the following example. To test the material stack as described above, III-nitride-based HEMT structures were grown by molecular beam epitaxy (MBE), and transistor source, drain, and gate contacts were fabricated on these structures under controlled radiation environments. As shown in FIG. 4, the samples consisted of a reference sample (REF) 401, which was a standard HEMT structure, and a QW sample (QW) 402 containing a series of indium gallium nitride (InGaN) QWs under the two-dimensional electron gas (2DEG). The structures were grown on semi-insulating GaN templates using a Veeco Gen II plasma-assisted molecular beam epitaxy (PAMBE) system. The GaN templates were ~5 µm thick and grown on c-plane sapphire using hydride vapor phase epitaxy (HVPE) resulting in a dislocation density of ~109 cm-2 with a resistivity of ~106 Ωcm.

The series of quantum wells constitute the only difference between the two samples. For both samples, following a ~1 h heatclean in ultrahigh vacuum with a base pressure of ~10-10 Torr, a 1500 nm unintentionally doped GaN buffer layer was grown at 830° C. under Ga-rich conditions. Then, for the REF sample 401, the active HEMT structure was grown consisting of a 20 nm Al0.35Ga0.65N layer, capped with 3 nm of GaN. For the QW sample 402, the buffer layer was interrupted several times to desorb excess Ga and insure a Ga free surface to begin the InGaN layers. Then, five periods of QWs consisting of 6 nm of In0.25Ga0.75N and 50 nm of GaN were grown at 550° C. The wells were capped with 10 nm of GaN. After this final GaN barrier layer, the temperature was increased to 830° C. At this higher temperature, an additional 40 nm of GaN was grown, followed by the same active HEMT structure as in the REF sample.

A two-dimensional QW parallel to, and far enough away from the channel of the device to not interact with its operation, captures excess free electrons and holes, forcing their wave functions to overlap and annihilate. In general, the diffusion length of the material governs the range over which these QWs have an influence in the device structure for this stray charge capture. Additionally, for the materials tested here, the polarization fields intrinsic to the III-nitride semiconductors have the added advantage of sweeping charges into the wells, extending their reach beyond the diffusion lengths of the carriers.

Figure 5:
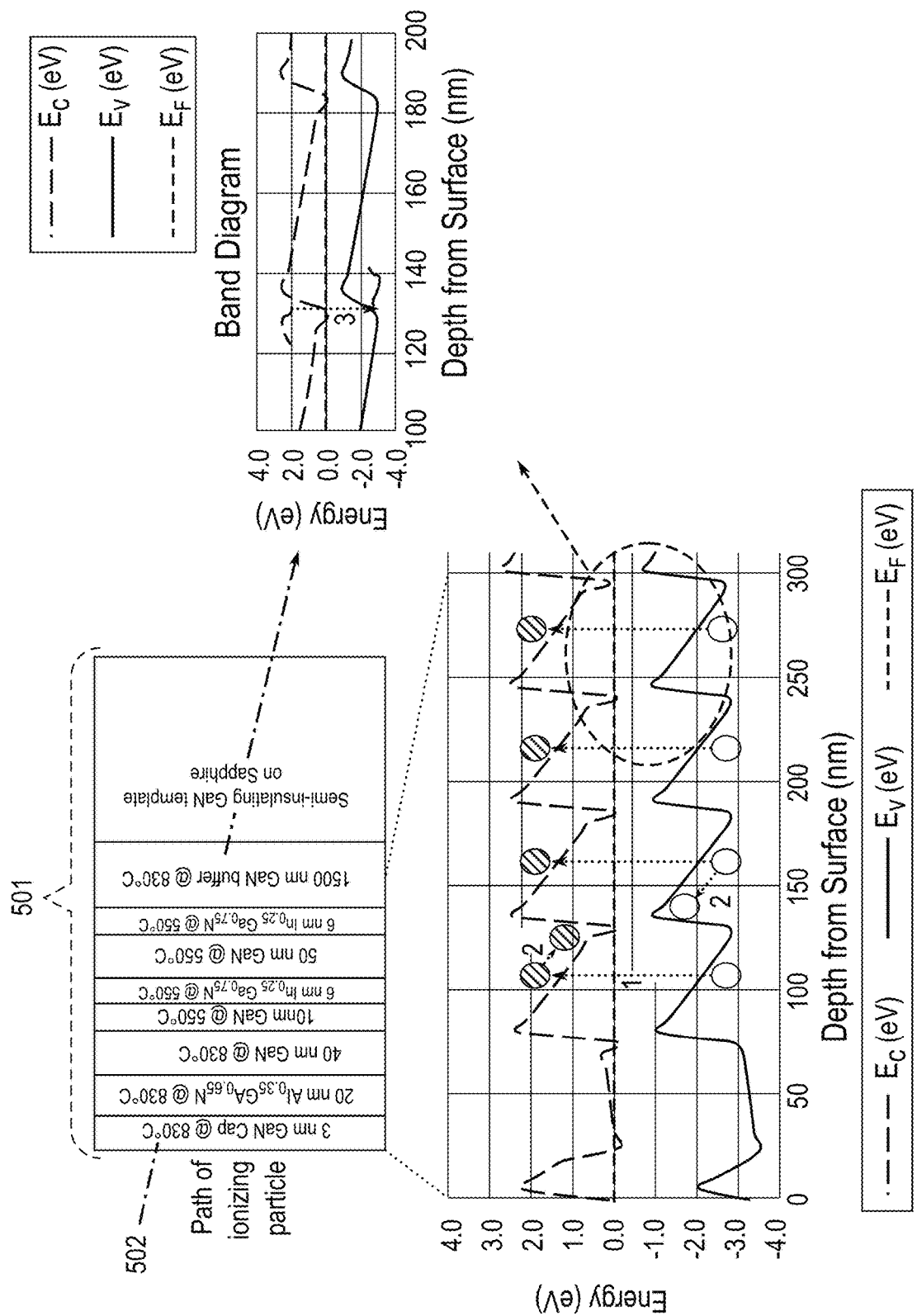
FIG. 5 shows a schematic demonstrating an ionizing particle incident on a device along with a band diagram of the material stack.

FIG. 5 shows a schematic demonstrating an ionizing particle incident on a device along with a band diagram of the material stack 501. The schematic demonstrates the theory behind the design of the material stack 501. As ionizing radiation 502 travels inside a device, it creates electron-hole pairs along its path. These electrons and holes generated by the radiation fall into the quantum wells confining their wave functions within the area of lower potential. This allows the charges to recombine and annihilate each other before an applied bias sweeps them out causing burnout, or subsequently the charges could migrate to trap sites within the channel resulting in a shift in the threshold voltage. Similarly if utilized in bipolar junction transistors, the recombination of charges within the wells disrupts any conductive ionized paths, which could otherwise cause latchup in unmediated ionizing scenarios.

To confirm the results of the growths, extensive material analysis was carried out. High-resolution x-ray diffraction (HRXRD) was performed using a Philips X'pert MRD system in which the x-rays were generated with a 1.6 kW electron beam on a Cu anode. The Kα1 line at 0.15406 nm was selected with a standard four-bounce Ge (220) monochromater using a vertical line focus and detected through a three-bounce (022) channel cut Ge analyzer crystal.

Figure 6:
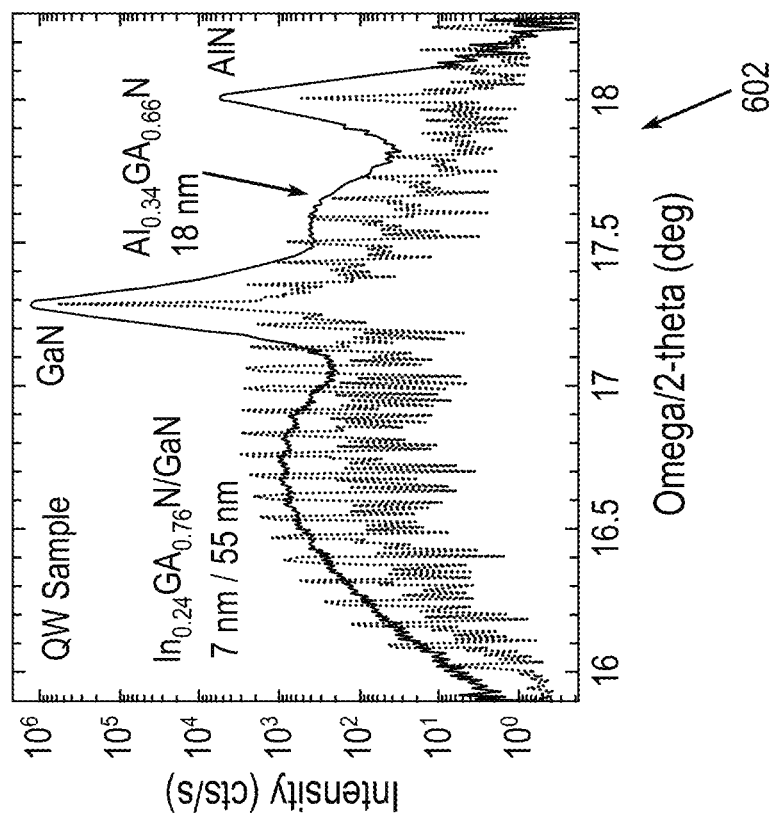
FIG. 6 shows Omega 2-Theta XRD scans from the REF and QW samples with their associated simulations.
Figure 6:
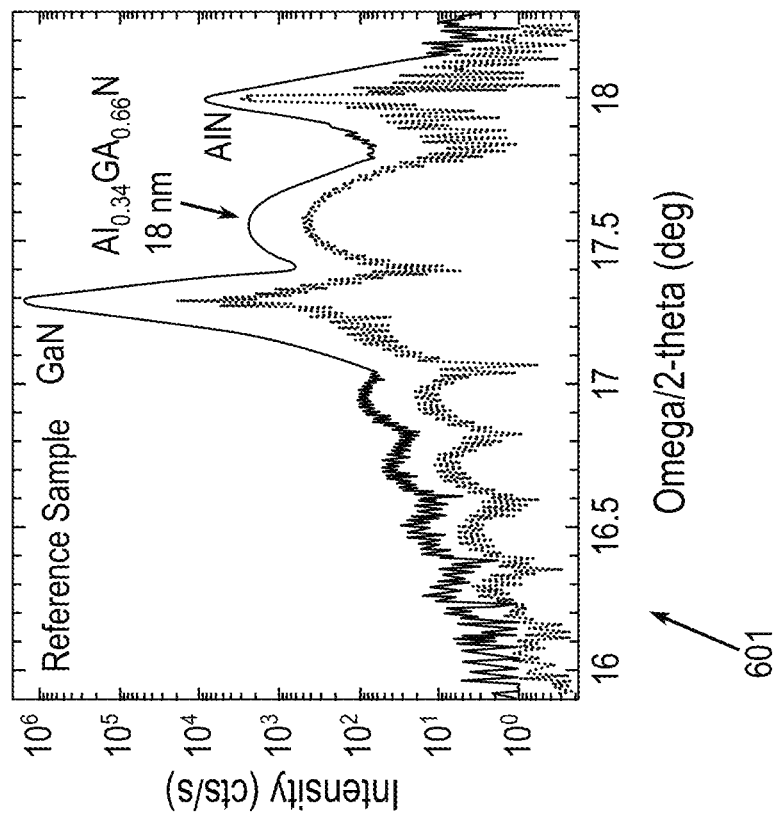

FIG. 6 shows the shows Omega 2-Theta XRD scans from the REF 601 and QW 602 samples with their associated simulations. The spectra exhibit peaks associated with the GaN/AlN/sapphire substrate and satellite peaks associated with the AlGaN layer as well as InGaN/GaN stack (in case of QW 602 sample). The satellite peak positions of the simulated x-ray diffraction spectra match the measured ones. Therefore, there is a good correlation between the structural parameters (thickness and composition) extracted from XRD data. It should be noted that the FWHM of the experimental ω/2θ XRD spectra of the 0002 reflection is mainly influenced by strain fields around threading dislocations and reflects the structural quality of the layers. Since this does not influence the peak positions, it is not considered in the standard methodology of the ω/2θ XRD spectra simulation when determining the layer thickness and composition.

Figure 7:
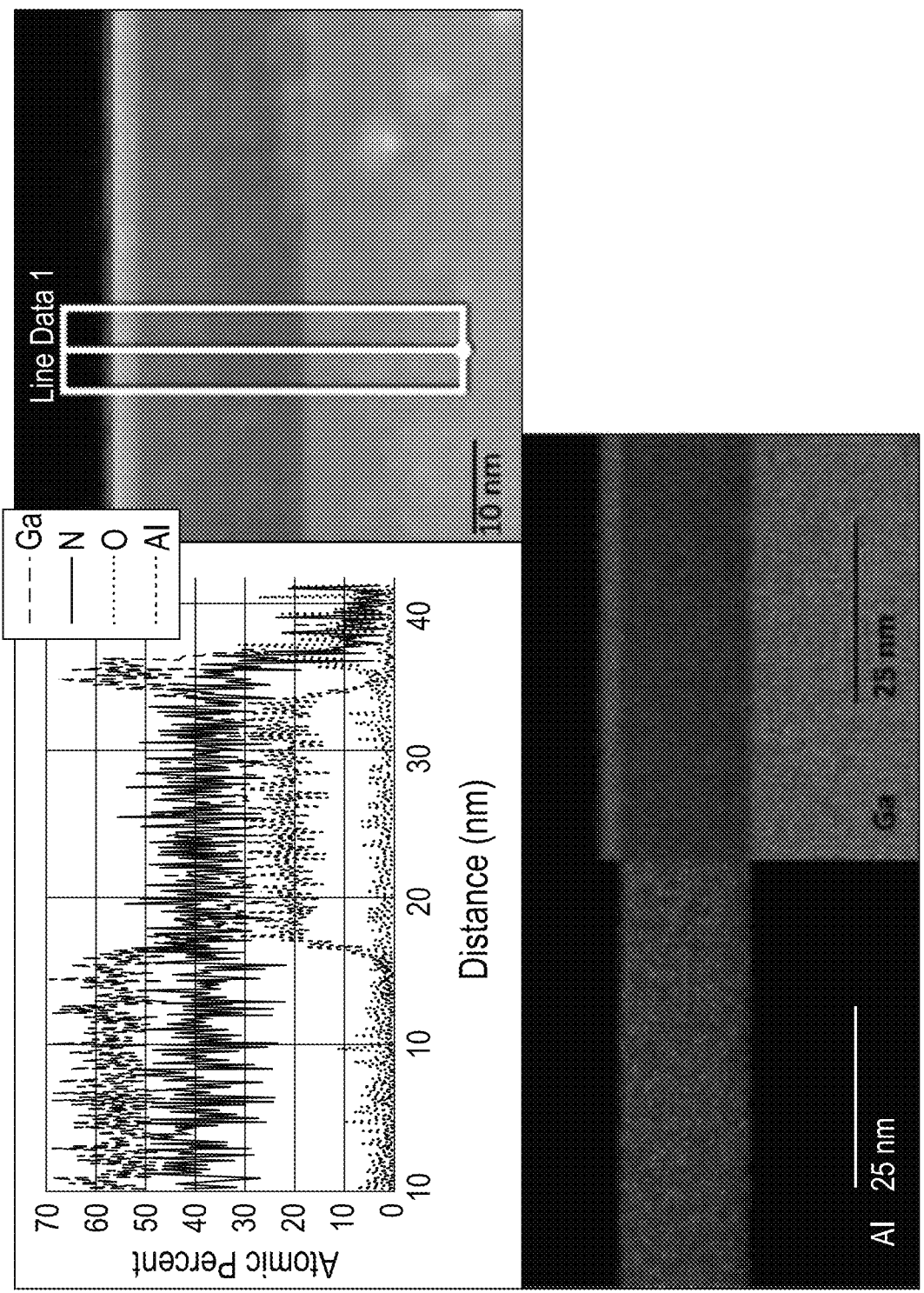
FIG. 7 shows TEM and EDX data from the REF sample and EDX mapping for aluminum and gallium.
Figure 8:
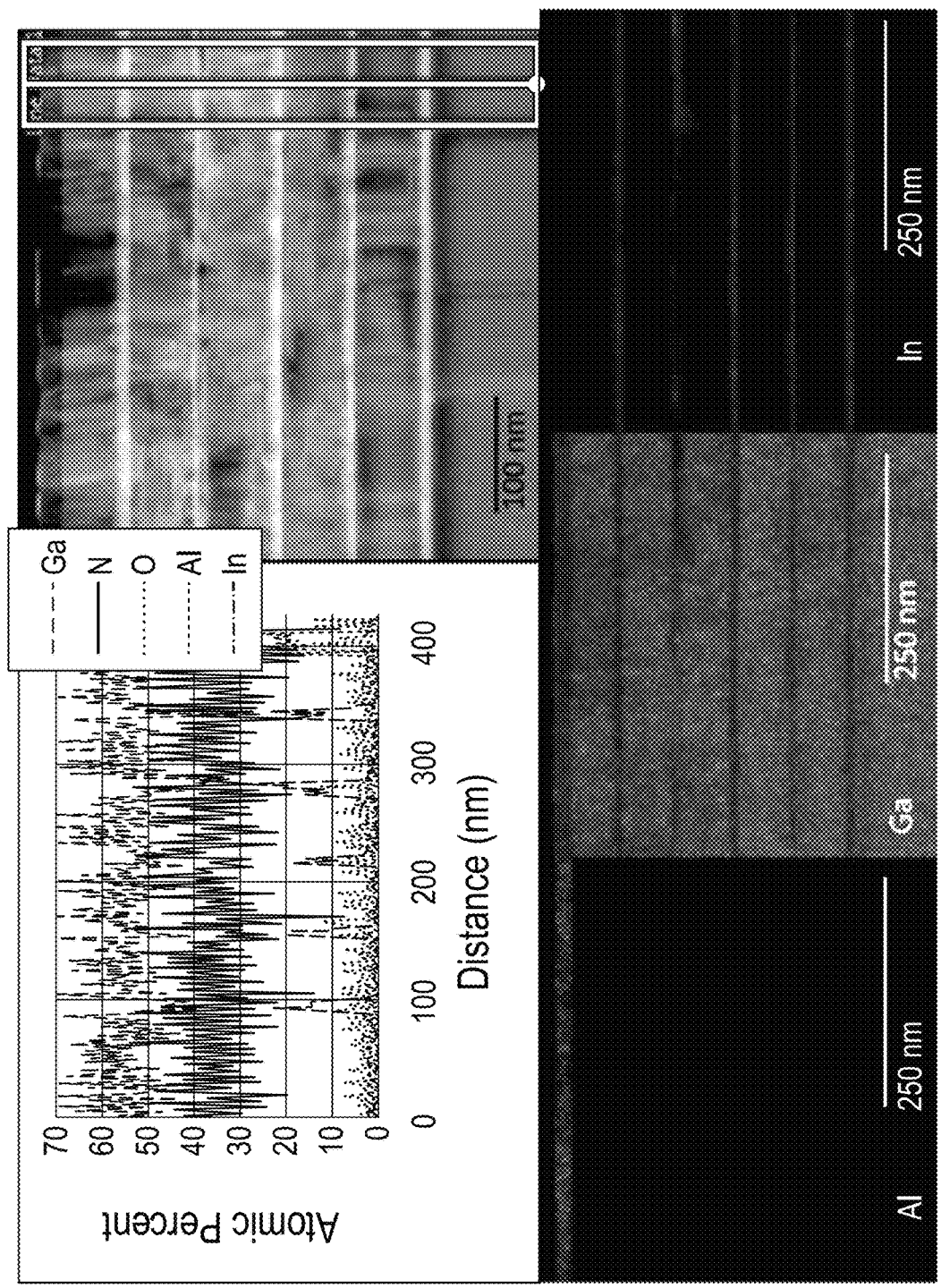
FIG. 8 shows TEM and EDX data from the QW sample and elemental mapping for metals.

Direct observation of the structures was derived from transmission electron microscopy (TEM) along with energy dispersive x-ray spectroscopy (EDX) to observe the chemical makeup of the layers. Data taken from the REF sample are shown in FIG. 7, which shows TEM and EDX data from the REF sample and EDX mapping for aluminum and gallium, while comparable data from the QW sample are shown in FIG. 8, which shows TEM and EDX data from the QW sample and elemental mapping for metals.

The TEM analysis correlates well with the XRD analysis, while both closely agree with the designed structure. A couple of items to note are provided herein. The oxygen traces indicate an increase near the surface, which is attributed to the SiO2 passivation. Below this depth, the oxygen concentration identifies as negligible as expected. Second, the indium wells show a small amount of indium migration into the GaN layers. This is attributed to the high AlGaN layer growth temperature near the end of the growth.

The REF and QW samples both underwent the same processing steps to fabricate HEMTs. The device fabrication process utilized AZ4330 photoresist for patterning. UV light through a contact shadow mask patterned the resist, while resist removal occurred with the AZ300 MIF developer. Mesa patterns were formed using $Cl_2$ and $BCl_3$ chemistry in an inductively coupled-plasma/reactive ion etching (ICP/RIE) system. A Ti(25 nm)/Al(100 nm)/Ni(50 nm)/Au(200 nm) evaporated stack annealed for 1 min at 800° C. formed the ohmics for the source and drain. Schottky, gate contacts were formed by depositing Ni(50 nm)/Au(200 nm) by e-beam evaporation. A surface passivation layer of 200 nm of SiO2 was deposited by plasma-assisted chemical vapor deposition (PECVD) at a substrate temperature of 150° C. Optical microscopy images of completed devices are shown in FIG. 2.

Irradiation of the devices took place in an electron linear accelerator (LINAC) where electrons incident on the devices serve as ionizing projectiles. The LINAC is a two section L-band accelerator, which is powered by two 20-MW klystrons and operates at 1.3 GHz. Each dose from the LINAC is capable of depositing up to 1000s of Rad(Si) in a short time window (typically less than 1 µs). Wire bonding connected the chip to a dual inline pin package (DIP), which sat in a printed circuit board (PCB) containing four 10 nF and six 100 nF capacitors. This is shown schematically in FIG. 2 The combination and values of these capacitors ensure a large enough current source and fast enough discharge rate to supply the active area of the device upon irradiation pulse.

Figure 9:
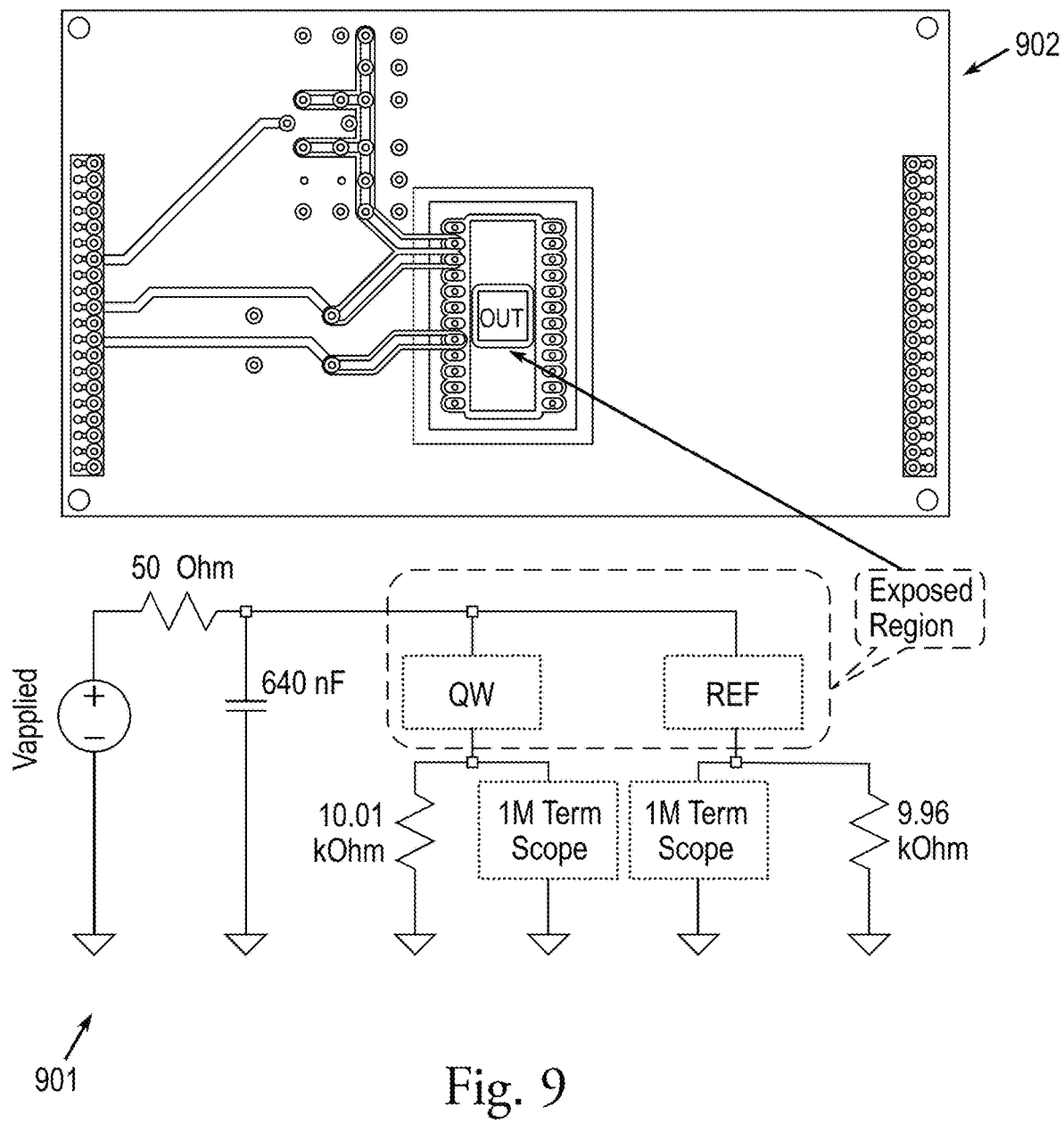
FIG. 9 shows a printed circuit board holding device under test (DUT) while under irradiation and a schematic of the complete test setup.

A schematic of the complete circuit 901 is illustrated in FIG. 9, which shows a printed circuit board holding device 902 under test (DUT) while under irradiation and a schematic of the complete test setup. The value of the 10 kΩ sense resistors allow the voltage signal generated across them to be discernable from background noise. Sense resistors of values 9.96 kΩ and 10.01 kΩ ran from the source of the REF and QW samples, respectively, to ground. Oscilloscopes terminated at 1 MΩ captured the voltage signals across these resistors while a Keithley 2410 power supply biased the drains. The gate contacts were leaky; therefore, they were set to float during irradiation. A 0.25 in. thick lead shielding plate with a 1 cm$^2$ hole centered over the device protected the PCB from irradiation while allowing dosage of the chip.

The setup received over 100 exposures at the LINAC with varying doses and rates, while the drain bias was varied from 1 V to 16 V. All parameters were intentionally controlled such that the device, REF, or QW did not suffer any destructive damage. However, the amount of radiation-induced photocurrent varied significantly.

RESULTS

Figure 10:
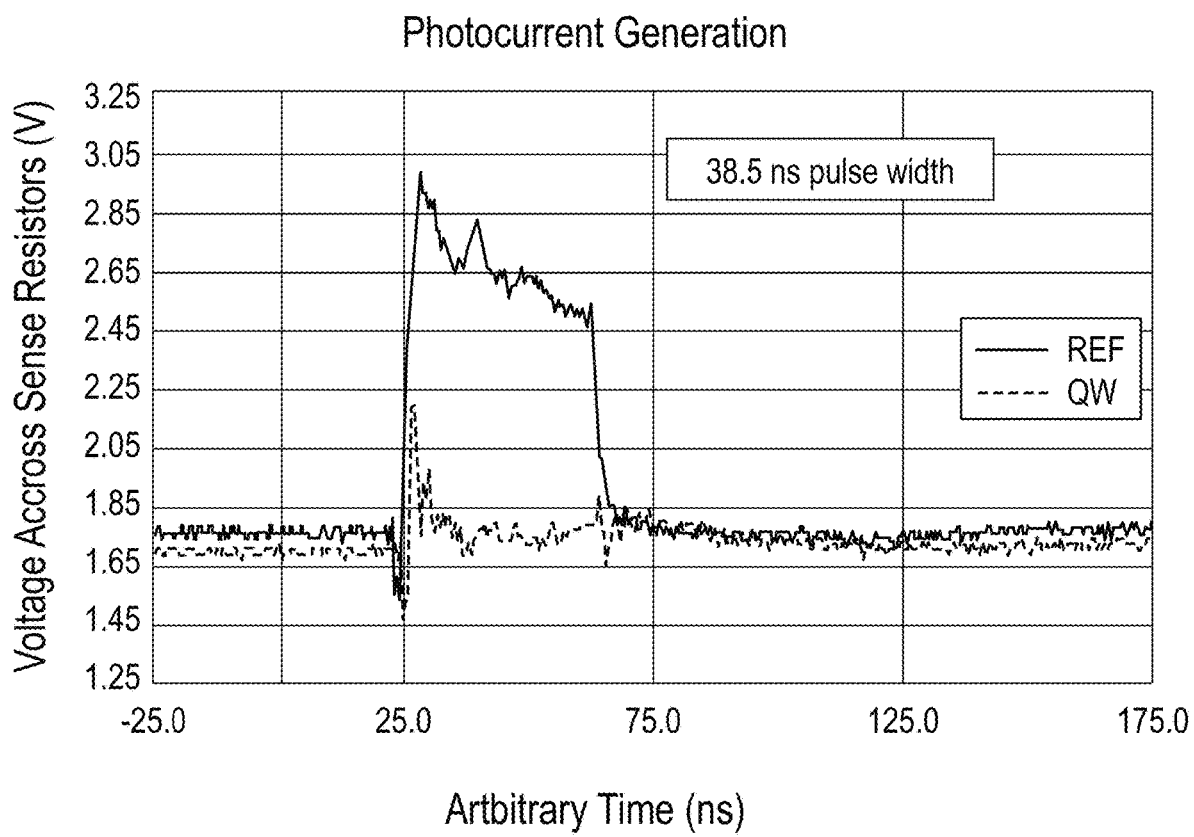
FIG. 10 shows the voltage captured during LINAC shot across two sense resistors.

FIG. 10 shows the voltage captured during LINAC shot across two sense resistors and demonstrates the ability of the InGaN quantum wells in the QW sample to capture photogenerated charges and prevent the electric field stemming from the drain sweeping the unpredicted charges out as photocurrent. Here, a significant difference can be seen in the responses of the devices with the QW gettered sample showing only minimal effects from the radiation exposure. The total photo-charge swept by each device can be calculated by dividing these voltage signals in FIG. 9 by their respective sense resistances. This results in a current, which can then be integrated over the time of the pulse, until the signals reach steady state again. Each steady state voltage value represented zero for the purposes of the signal integration, independent for each signal. These calculations yield 35.202 nC for the REF sample and 0.27586 nC for the QW sample. This represents a reduction of ionized photocurrent reaching the channel of the device by 99.92% through the use of the QW charge-getter structures.

Figure 11:
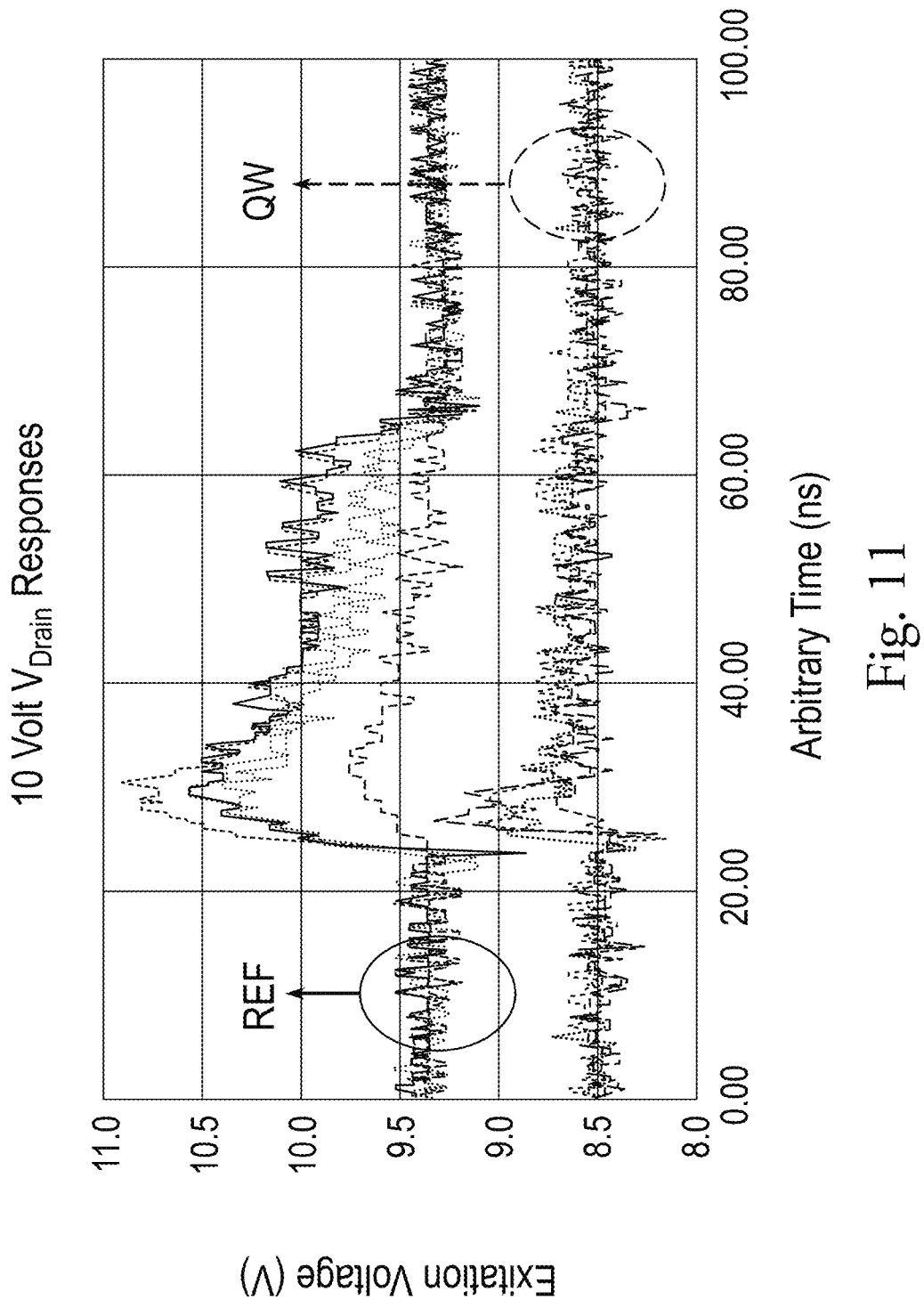
FIG. 11 shows REF and QW reactions to radiation exposure rates while held at a VDrain of 10 V.

FIG. 11 shows REF and QW reactions to radiation exposure rates while held at a VDrain of 10 V. The REF and QW responses for each shot demonstrate the charge gettering ability of the quantum well under the 2DEG. The REF and QW signals display a definite separation between each other, even when plotted on the same vertical scale as they appear here.

Table I lists the total photogenerated charge, QPP, for the four exposures of FIG. 11. As the radiation exposure rate increases, QPP for devices with no quantum wells also increases at roughly a 1:1 rate. In fact, it has been shown that for these types of devices, the photocurrent should scale linearly with the radiation exposure rate. The devices containing the charge gettering QWs showed a reduction in QPP by an average of 52.7%. However, the effects are dramatically improved at higher rates.

TABLE I

Comparison of photo-charge swept into a 10 V biased drain between reference samples and samples containing quantum wells. $Q_{pp}$ values derived from integrating the photocurrent signal over the shot time and removing the quiescent background value.

| Normalized radiation exposure rate [Rad(si)/s] | $Q_{pp}$ with no quantum well ($10^{-8}$ C) | $Q_{pp}$ with quantum well ($10^{-8}$ C) | Percent of $Q_{pp}$ reduction |
|---|---|---|---|
| 1 | 0.0474 | 0.0467 | 1.5% |
| 2.3 | 0.1862 | 0.0778 | 58.2% |
| 2.9 | 0.2357 | 0.0691 | 70.7% |
| 4.0 | 0.306 | 0.0598 | 80.5% |

Table II presents a similar set of data, representing the device operation with a 1 V drain bias. The results are similar.

TABLE II

Data captured while the drain received a bias of 1 V. The average photo-generated charge saw a reduction of 55.8%.

| Normalized radiation exposure rate [Rad(si)/s] | $Q_{pp}$ with no quantum well ($10^{-8}$ C) | $Q_{pp}$ with quantum well ($10^{-8}$ C) | Percent of $Q_{pp}$ reduction |
|---|---|---|---|
| 1 | 0.1206 | 0.0869 | 27.9% |
| 1.4 | 0.7104 | 0.097 | 43.1% |
| 2.4 | 0.276 | 0.0751 | 72.8% |
| 3.7 | 0.308 | 0.0631 | 79.5% |

CONCLUSIONS

The data here show the feasibility of utilizing band engineering to getter excess charges generated in devices when exposed to ionizing radiation. Material quality and structure design can be further optimized to improve performance, while at the same time there is no additional overhead for the processing of these devices in addition to commonly fabricated HEMT power devices. Scaling up this type of radiation protection for high volume manufacturing needs would be trivial, enabling a seamless integration into present device fabrication flow at the high volume manufacturing level.

Applying the process described herein to devices utilized in space and strategic environments where ionizing radiation poses threats to device reliability enables performance that is more robust and predictable than devices without the modification. The inventive concept presented herein is neither limited to quantum well designs nor to nitride-based devices. The idea carries similarly to the AlGaAs/GaAs system or germanium/silicon as additional non-limiting examples. Additionally, as a slight variation on the theme, wide bandgap materials such as aluminum nitride could be utilized to create blocking layers for additional charge isolation. The ability to create the gettering structures without the addition of smaller bandgap material could prove useful in optically active devices.

Although the invention has been described in detail with reference to certain preferred embodiments, variations and modifications exist within the spirit and scope of the invention as described and defined in the following claims.

The invention claimed is:

1. A radiation hardened microelectronic device comprising:
   a transistor comprising a conductive channel;
   a material stack comprising:
      a capping layer;
      one or more barrier layers comprising a high band gap;
      one or more quantum structures comprising a small band gap; and
      a substrate;
   wherein said one or more quantum structures are positioned in close proximity to said transistor conductive channel to form a quantum well charge getter structure comprising a low energy area beneath said transistor;
   wherein said quantum well charge getter structure getters ionizing radiation by trapping and confining electron-hole pair wave functions produced from said ionizing radiation within said low energy areas, which causes said wave functions to overlap, recombine, and produce light emission, thereby reducing the amount of said ionizing radiation that reaches said conductive channel of said transistor and hardening said microelectronic device.

2. The device of claim 1, wherein said material stack comprises, in order:
   a capping layer comprising a highly doped region in contact with said transistor;
   a first barrier layer comprising a high band gap;
   an active quantum well;
   a second barrier layer comprising a high band gap;
   a quantum structure getter comprising a small band gap;
   a third barrier layer comprising a high band gap; and
   a substrate.

3. The device of claim 1, wherein said microelectronic is constructed from a semiconductor selected from the group consisting of Si, Ge, Nitrides, Arsenides, inorganic compounds, and oxides.

4. The device of claim 1, wherein said quantum well charge getter structure is selected from the group consisting of quantum dots, quantum wells, wires, dots, super lattices, and combinations thereof.

5. The device of claim 1, wherein said quantum well charge getter structure is constructed of one or more repeated units of quantum dots, quantum wells, wires, dots, or super lattices.

6. The device of claim 1, wherein said quantum well charge getter structure reduces the amount of said ionizing radiation that reaches said conductive channel of said transistor by greater than 99% when compared with a reference transistor that does not include a quantum well charge getter structure.

7. The device of claim 1, wherein said capping layer comprises a highly doped region in contact with said transistor.

8. A method of hardening a microelectronic device against radiation comprising:
   providing a transistor comprising a conductive channel;
   providing a material stack comprising:
      a capping layer;
      one or more barrier layers comprising a high band gap;
      one or more quantum structures comprising a small band gap; and
      a substrate;
   forming one or more quantum well charge getter structures comprising a low energy area beneath said transistor;
   wherein said quantum well charge getter structure getters ionizing radiation by trapping and confining electron-hole pair wave functions produced from said ionizing radiation within said low energy areas, which causes said wave functions to overlap, recombine, and produce light emission, thereby reducing the amount of said ionizing radiation that reaches said conductive channel of said transistor and hardening said microelectronic device;
   wherein said quantum well charge getter structure reduces the amount of said ionizing radiation that reaches said conductive channel of said transistor by greater than 99% when compared with a reference transistor that does not include a quantum well charge getter structure.

9. The method of claim 8, wherein said material stack comprises, in order:
   a capping layer comprising a highly doped region in contact with said transistor;
   a first barrier layer comprising a high band gap;
   an active quantum well;
   a second barrier layer comprising a high band gap;
   a quantum structure getter comprising a small band gap;
   a third barrier layer comprising a high band gap; and
   a substrate.

10. The method of claim 8, wherein said microelectronic is constructed from a semiconductor selected from the group consisting of Si, Ge, Nitrides, Arsenides, inorganic compounds, and oxides.

11. The method of claim 8, wherein said quantum well charge getter structure is selected from the group consisting of quantum dots, quantum wells, wires, dots, super lattices, and combinations thereof.

12. The method of claim 11, wherein said quantum well charge getter structure is constructed of one or more repeated units of quantum dots, quantum wells, wires, dots, or super lattices.

13. The method of claim 8, wherein said capping layer comprises a highly doped region in contact with said transistor.

14. A method of hardening a microelectronic device against radiation comprising:
   providing a transistor comprising a conductive channel;
   forming one or more quantum well charge getter structures comprising a low energy area beneath said transistor;
   wherein said quantum well charge getter structure getters ionizing radiation by trapping and confining electron-hole pair wave functions produced from said ionizing radiation within said low energy areas, which causes said wave functions to overlap, recombine, and produce light emission, thereby reducing the amount of said ionizing radiation that reaches said conductive channel of said transistor and hardening said microelectronic device.

15. The method of claim 14, wherein said quantum well charge getter structure reduces the amount of said ionizing radiation that reaches said conductive channel of said transistor by greater than 99% when compared with a reference transistor that does not include a quantum well charge getter structure.

16. The method of claim 14, wherein said microelectronic is constructed from a semiconductor selected from the group consisting of Si, Ge, Nitrides, Arsenides, inorganic compounds, and oxides.

17. The method of claim 14, wherein said quantum well charge getter structure is selected from the group consisting of quantum dots, quantum wells, wires, dots, super lattices, and combinations thereof.

18. The method of claim 17, wherein said quantum well charge getter structure is constructed of one or more repeated units of quantum dots, quantum wells, wires, dots, or super lattices.

* * * * *